United States Patent
Han et al.

(10) Patent No.: US 7,830,213 B2
(45) Date of Patent: Nov. 9, 2010

(54) SIGNAL GENERATOR, SIGNAL GENERATION METHOD, AND RF COMMUNICATION SYSTEM USING THE SAME

(75) Inventors: Sang-Min Han, Hwaseong-si (KR); Seong-soo Lee, Suwon-si (KR); Young-hwan Kim, Hwaseong-si (KR); Alexander S. Dmitriev, Moscow (RU)

(73) Assignees: Samsung Electronics Co., Ltd., Suwon-si (KR); Institute of Radio Engineering and Electronics of RAS, Moscow (RU)

( * ) Notice: Subject to any disclaimer, the term of this patent is extended or adjusted under 35 U.S.C. 154(b) by 1085 days.

(21) Appl. No.: 11/523,534

(22) Filed: Sep. 20, 2006

(65) Prior Publication Data
US 2007/0248030 A1 Oct. 25, 2007

(30) Foreign Application Priority Data
Apr. 19, 2006 (KR) .................. 10-2006-0035448

(51) Int. Cl.
*H03B 1/00* (2006.01)
*H03B 5/24* (2006.01)
*H03B 29/00* (2006.01)
*H03C 1/00* (2006.01)
*H03K 3/03* (2006.01)
*H03K 7/00* (2006.01)
*H04L 27/00* (2006.01)

(52) U.S. Cl. .............. 331/57; 331/74; 331/78; 331/177 V; 332/106; 375/130; 375/295

(58) Field of Classification Search .................. 331/57, 331/74, 78, 108 B, 135–137, 177 V; 332/106; 375/130, 295
See application file for complete search history.

(56) References Cited

U.S. PATENT DOCUMENTS

| 4,891,609 A * | 1/1990 | Eilley ......................... 331/57 |
| 5,191,301 A * | 3/1993 | Mullgrav, Jr. ................ 331/57 |
| 6,159,753 A * | 12/2000 | Winer et al. .................. 438/4 |
| 6,396,358 B1 * | 5/2002 | Poss et al. ..................... 331/57 |
| 6,445,253 B1 * | 9/2002 | Talbot ......................... 331/57 |
| 7,411,466 B2 * | 8/2008 | Alford ......................... 331/158 |

* cited by examiner

*Primary Examiner*—David Mis
(74) *Attorney, Agent, or Firm*—Sughrue Mion, PLLC

(57) ABSTRACT

A signal generator, a signal generation method, and a communication system using the same are provided. The signal generator includes a plurality of nonlinear elements which are connected in a ring; and a signal distributor which is arranged in the ring to form a closed loop, feeds part of a signal to one of the plurality of the nonlinear elements, and outputs signal generated by one of the plurality of nonlinear elements. The method includes arranging a plurality of nonlinear elements connected in a ring; inputting a signal to one of the nonlinear elements; amplifying the signal; receiving the amplified signal and generating a harmonic component of a frequency; clipping the signal; and feeding part of the signal back to one of the nonlinear elements and outputting a remainder of the signal. The system includes a chaotic signal generator; a signal distributor; a modulator; and a transmission circuit.

28 Claims, 13 Drawing Sheets

SIGNAL GENERATOR, SIGNAL GENERATION METHOD, AND RF COMMUNICATION SYSTEM USING THE SAME

CROSS-REFERENCE TO RELATED APPLICATIONS

This application claims priority from Korean Patent Application No. 10-2006-0035448, filed Apr. 19, 2006 in the Korean Intellectual Property Office, the entire disclosure of which is incorporated herein by reference.

BACKGROUND OF THE INVENTION

1. Field of the Invention

Device, methods, and systems consistent with the present invention generally relate to a signal generator, a signal generation method, and a radio frequency (RF) communication system.

2. Description of the Related Art

Typically, a spread spectrum communication signal is transmitted by spreading the signal over a bandwidth much wider than the bandwidth of the signal to be transmitted. The spread spectrum communication includes a method using a carrier of narrow-band having a certain cycle, such as code division multiple access (CDMA), and a method using a carrier of broadband.

The method using the narrow-band carrier modulates the frequency to make a frequency band of information to transmit narrower than the frequency band of the carrier. The method using the broadband carrier modulates the frequency to make a frequency band of information to transmit wider than the frequency band of the carrier.

The carrier adapted for spread spectrum communication, mainly, uses sine wave, pulse and the like. The carrier such as a sine wave or a pulse, needs to raise to a specific frequency to transmit data. To this end, in a communication system, a transmitter requires constituent elements for up-converting the data from the baseband to a specific frequency, and a receiver requires constituent elements for down-converting the data having the raised frequency to the baseband.

The transmitter includes a voltage controlled oscillator (VCO) for generating a frequency required for the data transmission, and a phase locked loop (PLL) for preventing the frequency generated at the VCO from being changed by external influences. The transmitter requires an up-mixer for up-converting the baseband data to the frequency generated at the VCO.

By contrast, the receiver, which receives an RF signal, requires a down-mixer for down-converting the carrier to baseband.

However, when the transmitter has the VCO, the PLL, the up-mixer and the like, a great amount of power is consumed and the up-mixer of a large size causes an increase in the size of the transmitter. Likewise, as the receiver also must use the down-mixer, its power consumption is considerable and its size is increased.

The IEEE 802.15.4a standardization group, which is a location-aware and power-efficient sensor network standardization group, currently is studying a next communication area by adding the location-awareness and power-efficiency functions to the mixed technology of the IEEE 802.15.4 (ZigBee) and 802.15.3 ultra wide band (UWB) standards.

To implement the power-efficiency function, a chaotic signal modulation is suggested. The chaotic signal modulation can be designed in hardware using a simple RF structure and does not require circuits such as VCOs, PLLs and mixers for the RF communication system. Accordingly, when the chaotic signal modulation is applied, the power consumption can be reduced to about one-third of the conventional power consumption, that is, to about 5 mW.

Hence, various designs have been suggested to enable the implementation of an RF communication system using chaotic signal modulation. The implementability of the system depends on the design of a chaotic signal generator which generates a chaotic signal.

Therefore, a demand exists for a method of designing a chaotic signal generator which can be easily implemented in an RF communication system using chaotic signal modulation.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above. The present invention provides a signal generator which can be easily implemented, a signal generation method, and a RF communication system using the same.

According to an aspect of the present invention, there is provided a signal generator including a plurality of nonlinear elements which are connected in a ring; and a signal distributor which is arranged in the ring to form a closed loop together with the plurality of the nonlinear elements, and feeds part of a signal to one of the plurality of the nonlinear elements, and outputs a signal generated by one of the plurality of nonlinear elements.

Each of the nonlinear elements may be amplifiers.

The plurality of the nonlinear elements may comprise a first amplifier, a second amplifier, and a third amplifier.

The first amplifier may operate in an amplification mode, the second amplifier may operate in a harmonic mode, and the third amplifier may operate in a non-linear clipping mode.

The first amplifier may receive the signal from the signal distributor and amplify the received signal at a certain amplification rate.

The second amplifier may receive an amplified signal from the first amplifier and generate harmonic components in a frequency spectrum.

The third amplifier may clip a signal received from the second amplifier at a certain level.

The signal generator may further include a filter which filters the signal which is output by the signal distributor based on a certain frequency bandwidth.

The filter may comprise a band pass filter (BPF).

A chaotic signal may be generated when the signal is repeatedly fed back to the first, second, and third amplifiers by the signal distributor.

Bias voltage may be supplied to at least one end of the first, second, and third amplifiers.

A first capacitor may be disposed at one side of the ring.

The signal generator may further comprise a second capacitor, wherein the first capacitor may be disposed between the first amplifier and the second amplifier, and the second capacitor may be disposed between the third amplifier and the signal distributor, respectively.

The first may be variable capacitor which capacitance.

The first and second capacitors may adjust a level of the signal output from the first and third amplifiers, and the generation of the chaotic signal.

The first and second capacitors may adjust a phase of the signal output from the ring to be a multiple of $2\pi$.

The first capacitor may adjust a total gain of the ring to be greater than 1.

The signal distributor may be a coupler which feeds part of the signal which is output from the third amplifier back to the first amplifier.

A coupling coefficient may set a level of the signal which is fed back.

According to another aspect of the present invention, there is provided a radio frequency (RF) communication system which includes a chaotic signal generator which comprises a plurality of nonlinear elements connected in a ring, and a signal distributor which is arranged in the ring, and feeds part of a signal to at least one of the plurality of the nonlinear elements, and outputs a signal generated by one of the plurality of nonlinear elements; a modulator which generates a chaotic carrier by combining the chaotic signal and a data signal which contains information; and a transmission circuit which includes an antenna and which transmits the chaotic carrier which is generated by the modulator.

According to another aspect of the present invention, there is provide a signal generation method which includes arranging a plurality of nonlinear elements connected in a ring; inputting a signal to one of the plurality of the nonlinear elements; amplifying, at the nonlinear elements, the signal at a certain amplification rate; receiving the amplified signal and generating a harmonic component of a frequency; clipping the signal at a certain level; and feeding part of the signal back to one of the plurality of the nonlinear elements and outputting a remainder of the signal.

BRIEF DESCRIPTION OF THE DRAWING FIGURES

The above and/or other aspects of the present invention will become more apparent and more readily appreciated from the following description of exemplary embodiments thereof, with reference to the accompanying drawings, in which.

DETAILED DESCRIPTION OF EXEMPLARY EMBODIMENTS OF THE PRESENT INVENTION

Figure 1A:
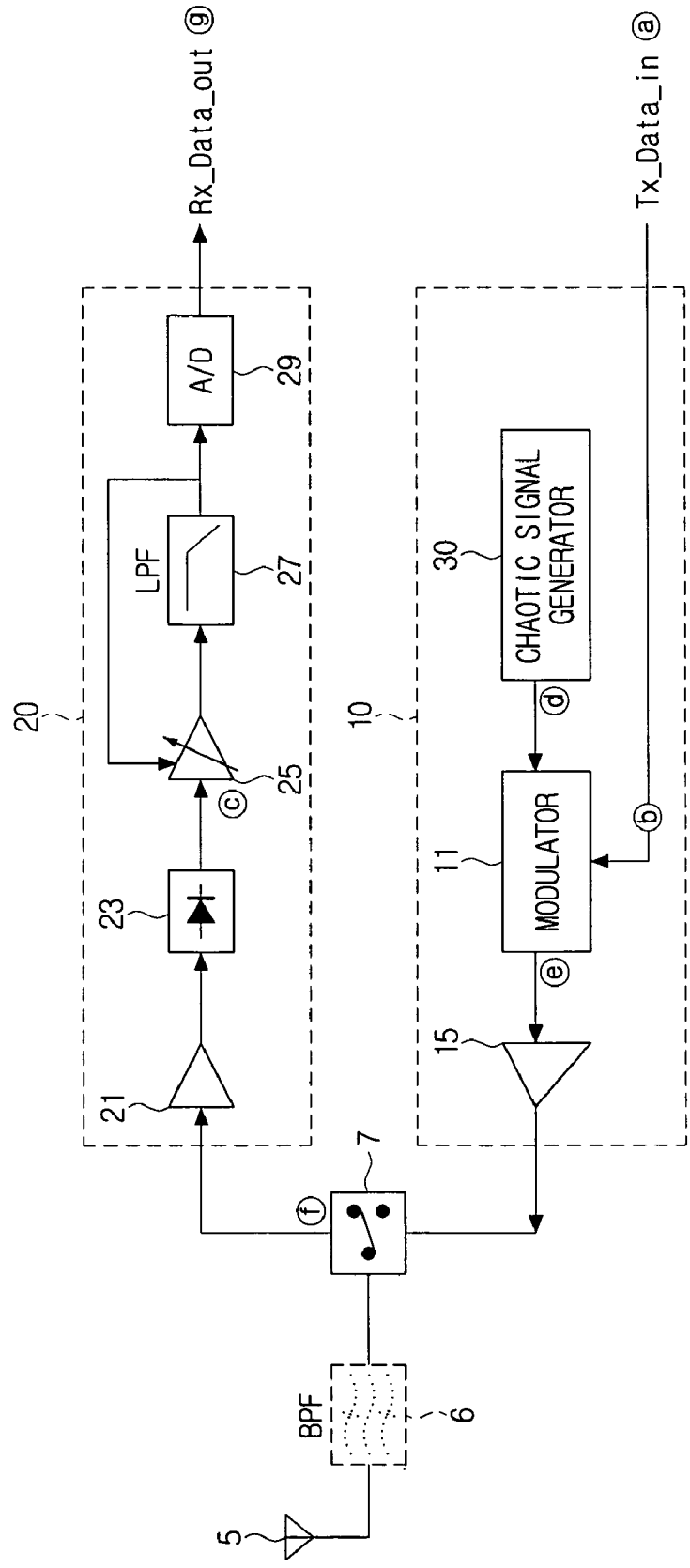
FIG. 1A is a block diagram of a transceiver of a radio frequency (RF) communication system using a chaotic signal according to an exemplary embodiment of the present invention.

Certain exemplary embodiments of the present invention will now be described in greater detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail, since they would obscure the invention in unnecessary detail.

FIG. 1A is a block diagram of a transceiver of a radio frequency (RF) communication system using a chaotic signal, and FIGS. 1B-1F show representative signal waveforms at areas ⓐ through ⓖ of FIG. 1A.

The transceiver of the RF communication system includes a transmission circuit 10 for transmitting a chaotic carrier acquired by modulating a data signal with a chaotic signal, and a reception circuit 20 for receiving the chaotic carrier and evaluating the data signal. The transceiver has an antenna 5 for transmission and reception, a switch 7 for connecting the antenna 5 to either the transmission circuit 10 or the reception circuit 20, and a band pass filter (BPF) 6 for filtering the chaotic carrier transmitted or received.

The transmission circuit 10 includes a chaotic signal generator 30, a modulator 11, and a power amplifier 15.

Figure 1B:
FIG. 1B is a graph showing a signal waveform at area ⓐ of the RF communication system of FIG. 1A.
Figure 1C:
FIG. 1C is a graph showing a signal waveform at area ⓑ and ⓖ of the RF communication system of FIG. 1A.
Figure 1D:
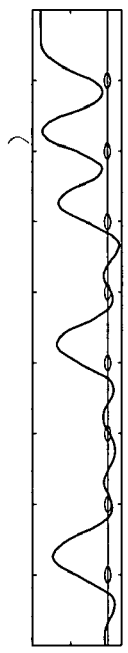
FIG. 1D is a graph showing a signal waveform at area ⓒ of the RF communication system of FIG. 1A.
Figure 1E:
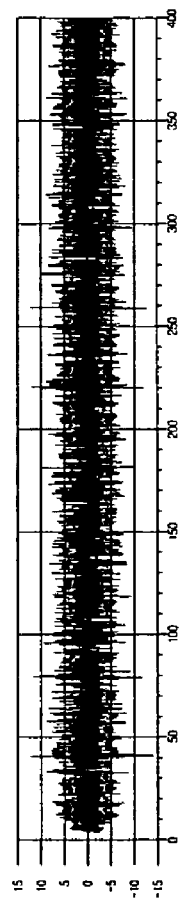
FIG. 1E is a graph showing a signal waveform at area ⓓ of the RF communication system of FIG. 1A.
Figure 2A:
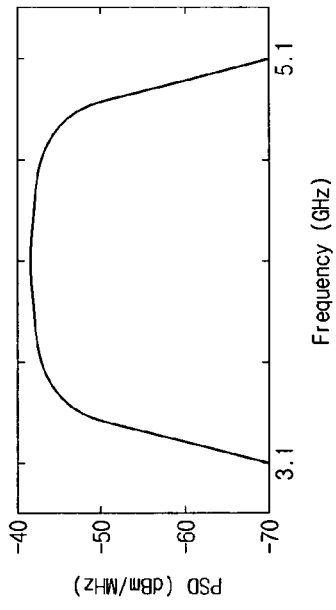
FIG. 2A is a graph showing the frequency domain of a chaotic signal which is generated at a chaotic signal generator.
Figure 2B:
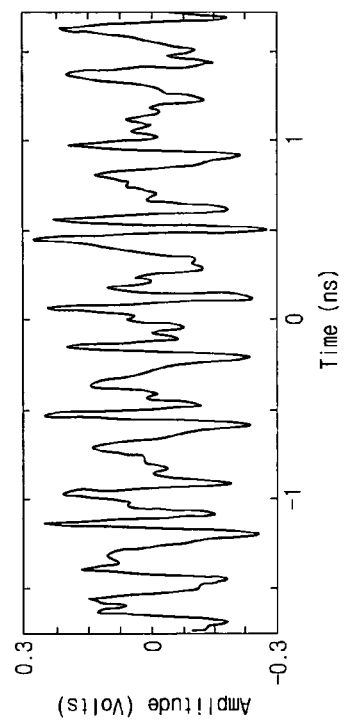
FIG. 2B is an enlarged view of the signal of FIG. 2A showing the waveform of the chaotic signal which is generated at a chaotic signal generator.

The chaotic signal generator 30 generates a chaotic signal having a plurality of frequency components in a certain frequency band. This frequency band may be preset. As shown in the graph of FIG. 1D illustrating the waveform at point ⓓ of FIG. 1A, the chaotic signal is generated from consecutive pulses having different cycles and amplitudes. FIG. 2B is a partially enlarged view of the chaotic signal at the point ⓓ of FIG. 1A. As shown in FIG. 2A, it can be seen that the chaotic signal is spread over the frequency band in view of the frequency domain. Note that the frequency band of the chaotic signal may vary according to the design of the chaotic signal generator 30. In FIG. 2A, the chaotic signal is spread over the frequency band from 3.1 GHz to 5.1 GHz which is the UWB band.

The structure of the chaotic signal generator 30 will be explained in detail later in reference to FIG. 3.

Figure 1F:
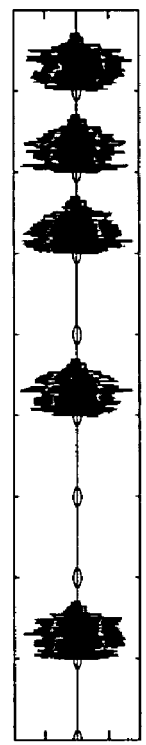
FIG. 1F is a graph showing a signal waveform at areas ⓔ and circle 'f' of the RF communication system of FIG. 1A.

Returning to FIG. 1A, the modulator 11 generates a chaotic carrier by combining the chaotic signal output from the chaotic signal generator 30, and the data signal. In doing so, as shown in the graph of FIG. 1B illustrating the signal at point ⓐ of FIG. 1A, a data bit which is formed in the binary of 0 and 1 is provided to the modulator 11 in the pulse form as shown in the graph of FIG. 1C illustrating the signal at point (b) of FIG. 1A. When the data signal and the chaotic signal are combined, the chaotic signal is generated such that the chaotic signal exists only in the area where the data signal information is contained as shown in the graph of FIG. 1F illustrating the signal at point (e) of FIG. 1A. FIG. 2E is an enlarged graph of a partial area of the chaotic carrier of the graph at point (e). Even after the modulation, the frequency band of the chaotic carrier, shown in FIG. 2D, is almost the same as the frequency band of the chaotic signal of FIG. 2A. It is noted that the pulse area of the chaotic signal has no relation with the frequency bandwidth.

The reception circuit 20 includes a low noise amplifier (LNA) 21, a detector 23, an automatic gain control (AGC) amplifier 25, a low pass filter (LPF) 27, and an analog-to-digital (A/D) converter 29.

The LNA 21 amplifies the chaotic carrier received through the antenna 5 and provides the amplified chaotic signal to the detector 23.

The detector 23 senses the chaotic carrier and extracts the data signal. The detector 23 is implemented using a diode. The chaotic carrier passing through the detector 23 forms the sine wave as shown in the graph of FIG. 1D illustrating the signal at point (c) in FIG. 1A.

The AGC amplifier 25 is able to increase and decrease the amplification rate. The AGC amplifier 25 amplifies the sine wave extracted by the detector 23 to a certain level. The LPF 27 filters the amplified sine wave so that the AID converter 29 can convert it to a digital signal.

Figure 2C:
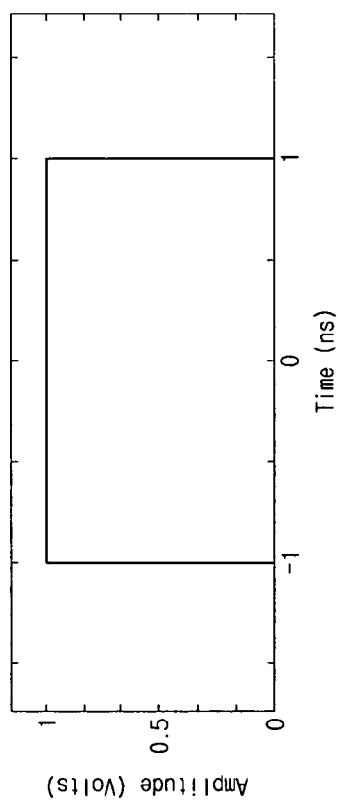
FIG. 2C is an enlarged graph of a data signal.
Figure 2D:
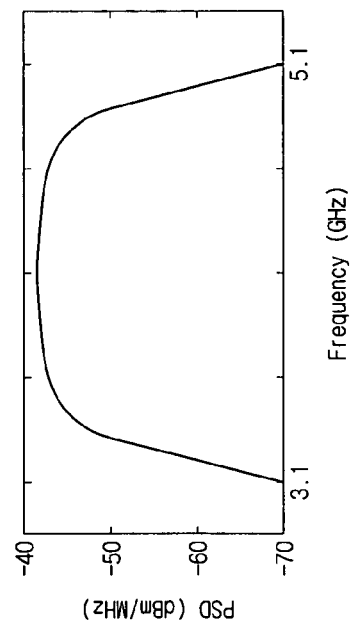
FIG. 2D is a graph showing the frequency domain of a chaotic carrier which is acquired by modulating the chaotic signal of FIG. 2A and the data signal of FIG. 2C.
Figure 2E:
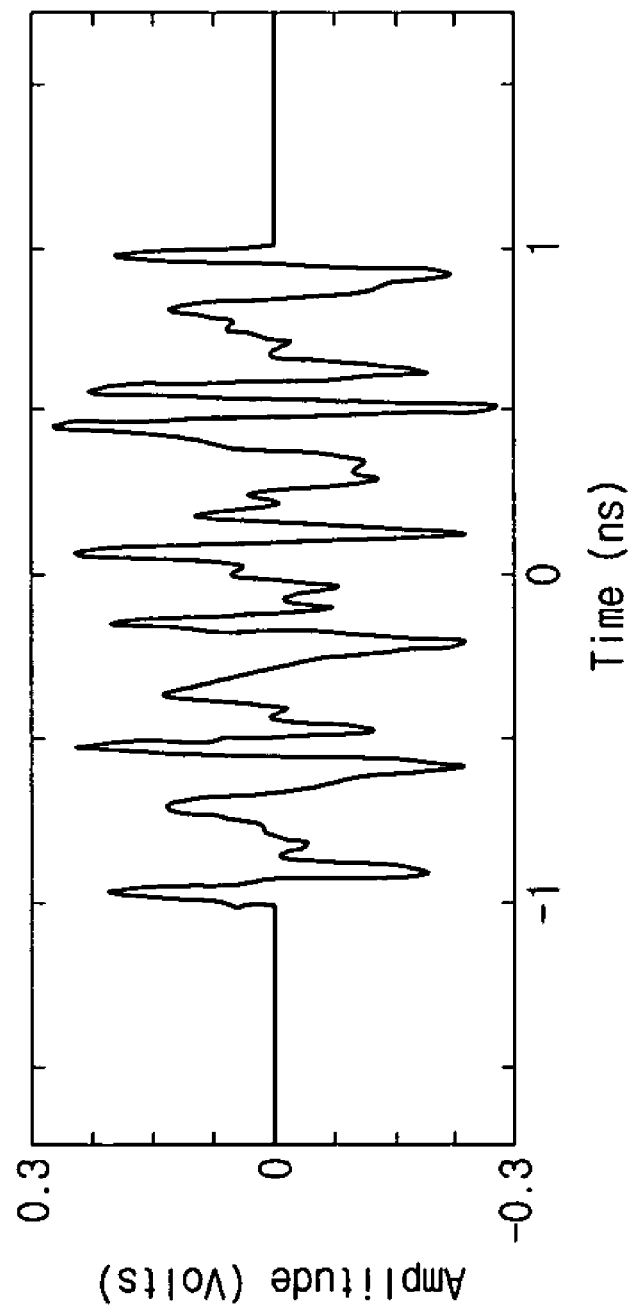
FIG. 2E is a graph of a chaotic carrier which is acquired by modulating the chaotic signal of FIG. 2A and the data signal of FIG. 2C.

A/D converter 29 converts the sine wave to the digital signal and thus extracts the data signal of the pulse type as shown in FIG. 2C.

Figure 3:
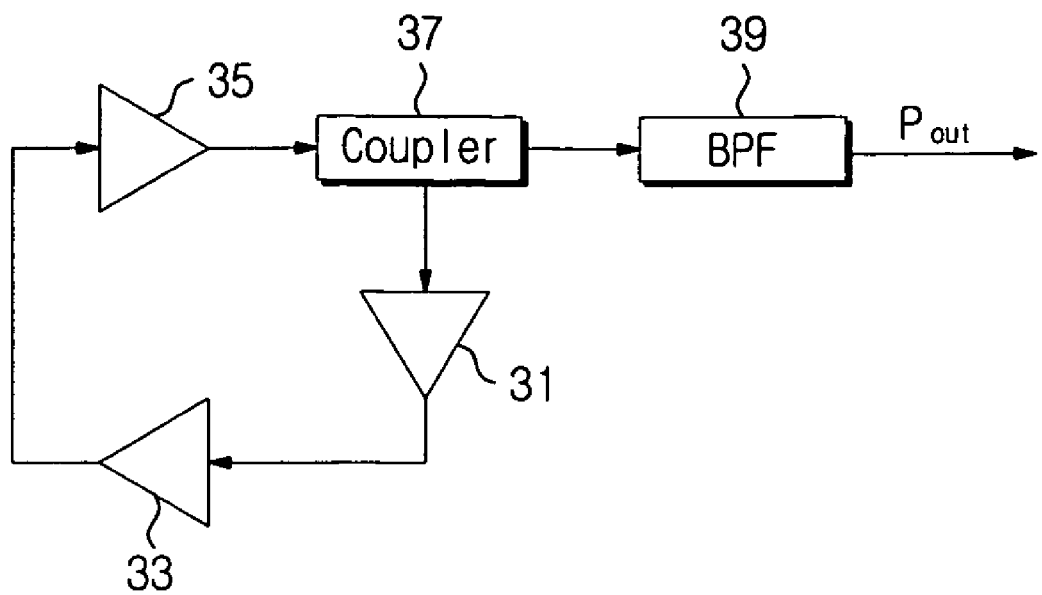
FIG. 3 is a simplified diagram of the chaotic signal generator according to an exemplary embodiment of the present invention.

FIG. 3 is a simplified diagram of the chaotic signal generator according to an exemplary embodiment of the present invention.

The chaotic signal generator 30 is of a ring type. The chaotic signal generator 30 includes a plurality of nonlinear elements 31, 33 and 35, a coupler 37, and a filter 39.

The plurality of nonlinear elements 31, 33 and 35 consists of three amplifiers which are interconnected in the form of ring. Herein, the amplifiers are referred to as first, second, and third amplifiers 31, 33 and 35, respectively.

The first amplifier 31 operates in an amplification mode and non-linearly amplifies an incoming signal according to an amplification rate. When the chaotic signal generator 30 initially operates, noise according to the power supply is provided to the first amplifier 31. After the signal is processed through the second and third amplifiers 33 and 35, the signal output from the third amplifier 35 is fed back to the first amplifier 31 by way of the coupler 37.

Figure 4A:
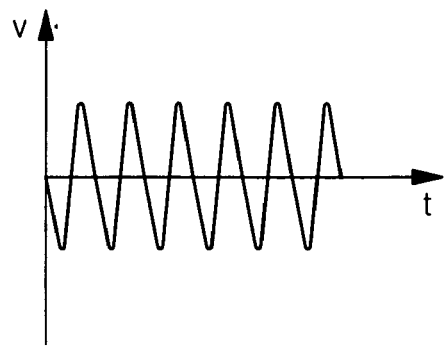
FIGS. 4A through 4E are graphs showing a signal waveform, which is generated at the chaotic signal generator of FIG. 3 according to modes, in the time domain.
Figure 4B:
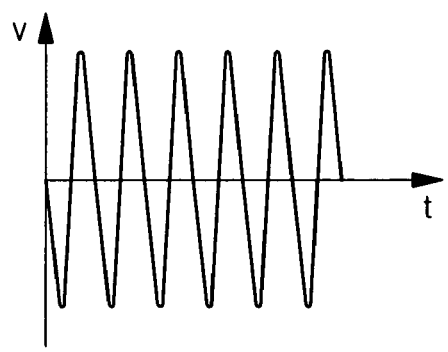
Figure 5A:
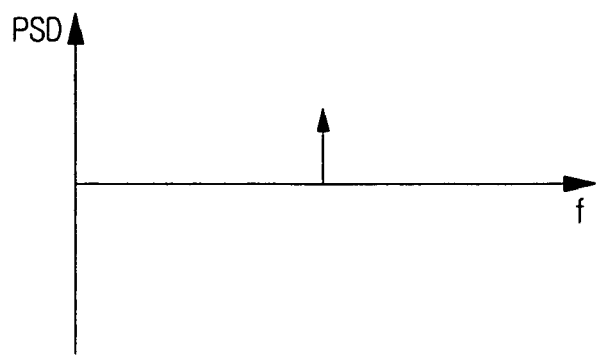
FIGS. 5A through 5E are graphs showing a signal spectrum, which is generated at the chaotic signal generator of FIG. 3 according to modes, in the frequency domain.
Figure 5B:
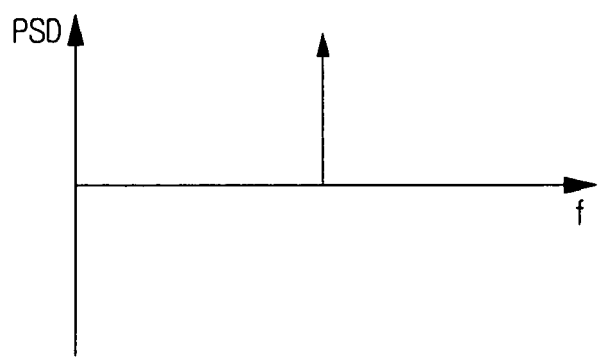

FIG. 4A shows the signal which is input to the first amplifier 31 at the initial operation of the chaotic signal generator 30. One signal, as shown in FIG. 4A, or multiple signals can be input to the first amplifier 31. The input signal is amplified and output as shown in FIG. 4B. In view of the frequency domain, the signals of FIGS. 4A and 4B have only one frequency component as shown in FIGS. 5A and 5B, respectively. The frequency component of FIG. 5B is amplified in a size alone, as compared with the FIG. 5A. On the y axis in the graph of FIGS. 5A through 5E, power spectral density is abbreviated as PSD.

The second amplifier 33 operates in a harmonic mode, and increases the degree of the frequency component of the signal amplified at the first amplifier 31. In other words, the second amplifier 33 generates a plurality of harmonic frequency components which are the multiple of the frequency amplified at the first amplifier 31.

Figure 4C:
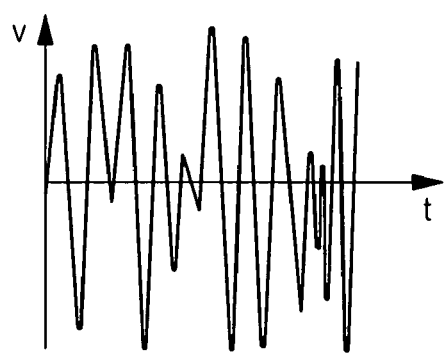
Figure 5C:
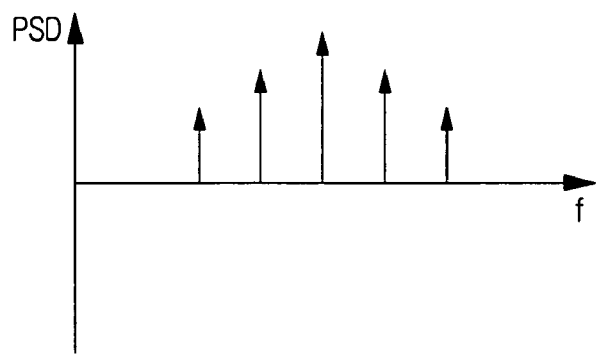

Accordingly, the second amplifier 33 generates a signal having the plurality of the frequency components as shown in FIG. 4C, by generating the harmonic frequency components. As one can see, there is the plurality of the frequency components generated in the signal output from the second amplifier 33 in view of the frequency domain, as shown in FIG. 5C.

The third amplifier 35 clips the signal of the second amplifier 33 at a certain level by operating in a clipping mode. The third amplifier 35 may clip an upper part and/or a lower part of the signal. In the exemplary embodiment of the present invention, the third amplifier 35 transforms the waveform by clipping the upper part and the lower part of the signal at a certain level.

Figure 4D:
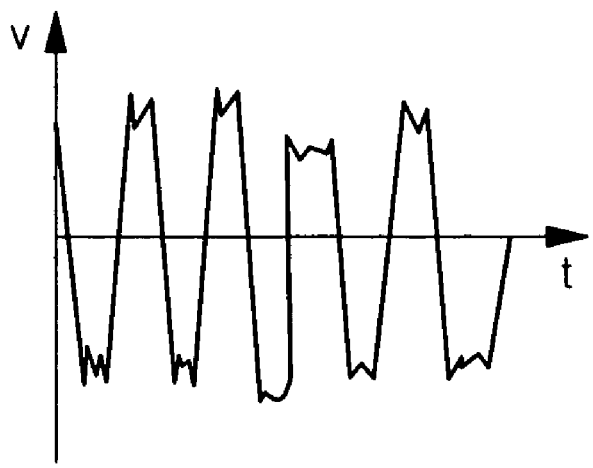
Figure 5D:
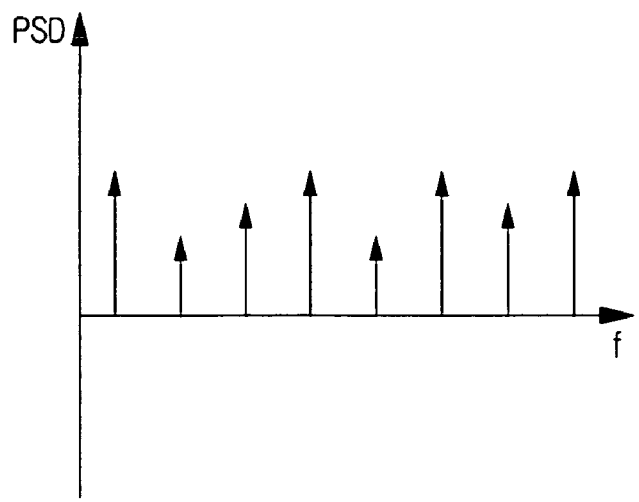

The signal clipped at the third amplifier 35 is transformed as shown in FIG. 4D. At the third amplifier 35, the frequency component increases with the clipping as shown in FIG. 5D, compared with the frequency component of FIG. 5C.

The coupler 37 forms a closed loop with the first, second, and third amplifiers 31, 33 and 35, and outputs most of the signal from the third amplifier 35 to the outside of the closed loop. That is, the coupler 37 feeds back only a part of the signal of the third amplifier 35 to the first amplifier 31. In doing so, a coupling coefficient determines the ratio of the signal output to the outside through the coupler 37 to the signal fed back to the first amplifier 31. For example, if the coupling coefficient is 10 dB, only ⅟10 of the signal is fed back to the first amplifier 31 and the rest is output to the outside.

Figure 4E:
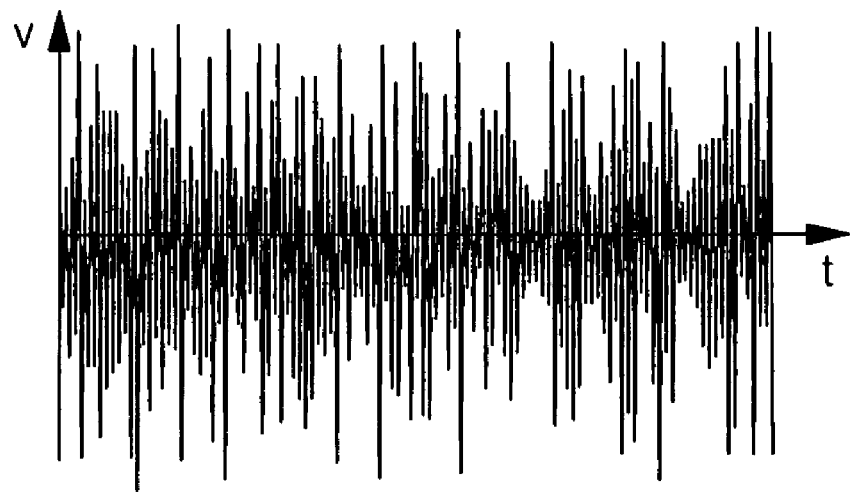
Figure 5E:
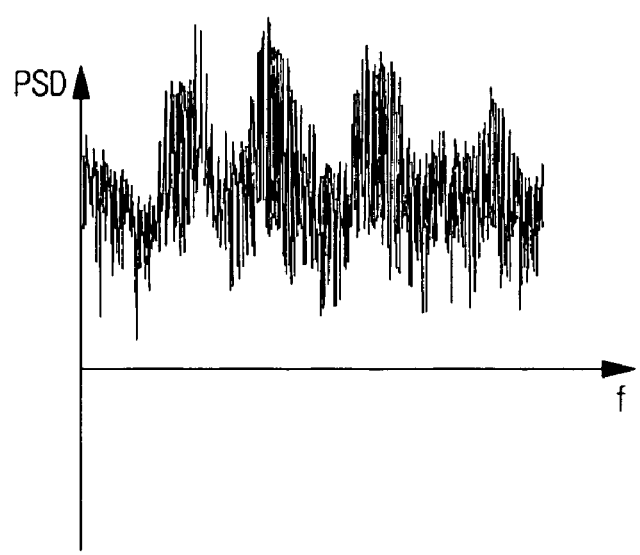

As the signal is fed back by the coupler 37, the signal is repeatedly and continuously processed by the first, second, and third amplifiers 31, 33 and 35. The signal waveform becomes similar to the noise signal, and the signal spectrum is widened in a specific frequency band. Thus, the chaotic signal of FIG. 4E is output from the coupler 37. It is noted that the spectral characteristics appear as shown in FIG. 5E with represents the frequency domain of FIG. 4E.

The output of the coupler 37 is filtered by the BPF 39. The BPF 39 filters a signal by a certain width based on a specific frequency band. The specific frequency band may be pre-defined. In a UWB wireless communication system, the specific frequency band is set to approximately 3 GHz~approximately 5 GHz. The BPF 39 thus outputs the chaotic signal having the plurality of the frequency components in the desired frequency band.

The frequency bandwidth of the chaotic signal produced at the chaotic signal generator 30 is determined by the operation range of the first, second, and third amplifiers 31, 33 and 35. For instance, when the operation frequency of the amplifier is approximately 100 MHz~approximately 5,500 MHz, the power spectrum of the chaotic signal 30 belongs to the same frequency range exactly.

Figure 6:
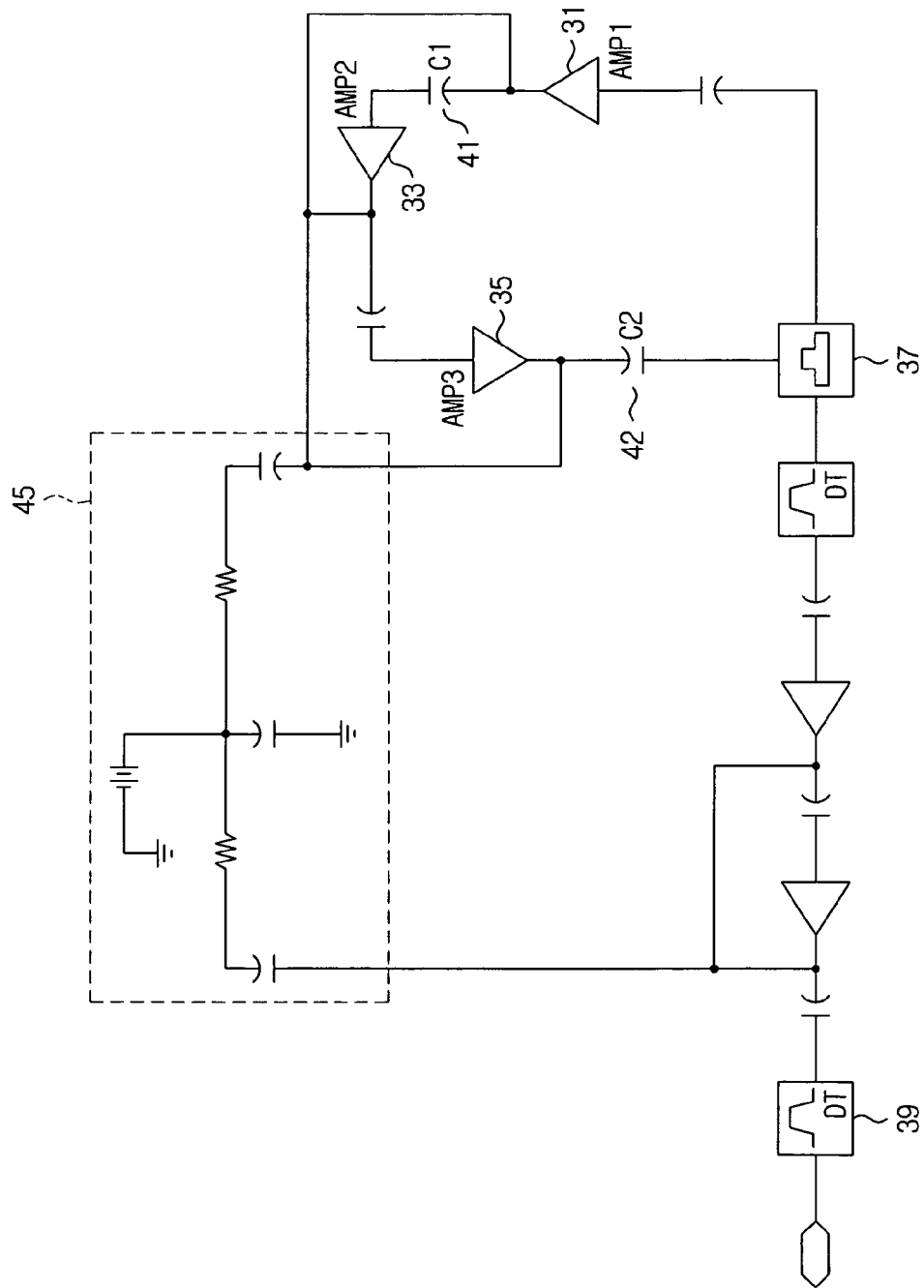
FIG. 6 is a circuit diagram of the chaotic signal generator of FIG. 1 according to an exemplary embodiment of the present invention.

FIG. 6 is a circuit diagram of the chaotic signal generator 30 of FIG. 1 according to an exemplary embodiment of the present invention.

As shown in FIG. 6, the chaotic signal generator 30 includes first, second, and third amplifiers 31, 33 and 35, a coupler 37, a BPF 39, first and second capacitors 41 and 42, and a bias voltage portion 45.

The first, second, and third amplifiers 31, 33 and 35, the coupler 37, and the BPF 39 are the same as those in FIGS. 3, 4A-4E and 5A-5E, and thus further explanation thereof will be omitted.

The first and second capacitors 41 and 42 are disposed between the first amplifier 31 and the second amplifier 33, and between the third amplifier 35 and the coupler 37, respectively. The first and second capacitors 41 and 42, which are part of the bias circuit of the first, second, and third amplifiers 31, 33 and 35, serve to adjust the size of the chaotic signal generated at the chaotic signal generator 30. Since the capacitor generally functions as a high pass filter when in a serial connection, the first and second capacitors 41 and 42 affect the frequency bandwidth of the chaotic signal.

Meanwhile, the chaotic signal generator 30 needs to meet two conditions for the oscillation, conditions which are similar to those of a ring oscillator. One of the two conditions is that the phase change of the signal which passes through the entire loop formed by the first, second, and third amplifiers 31, 33 and 35, and the first and second capacitors 41 and 42 should be 360°, that is, a multiple of $2\pi$. The other condition is that the gain of the entire loop should be greater than 1.

The first and second capacitors 41 and 42, together with the first, second, and third amplifiers 31, 33 and 35, are adjusted to satisfy the oscillation conditions. The first and second capacitors 41 and 42 may be implemented using a variable capacitor.

One end of the bias voltage portion 45 is connected between the BPF 39 and the coupler 37, and the other end is connected to three power lines extending from back ends of the first, second, and third amplifiers 31, 33, and 35. The bias voltage portion 45 supplies bias voltage to the first, second, and third amplifiers 31, 33 and 35.

Figure 7:
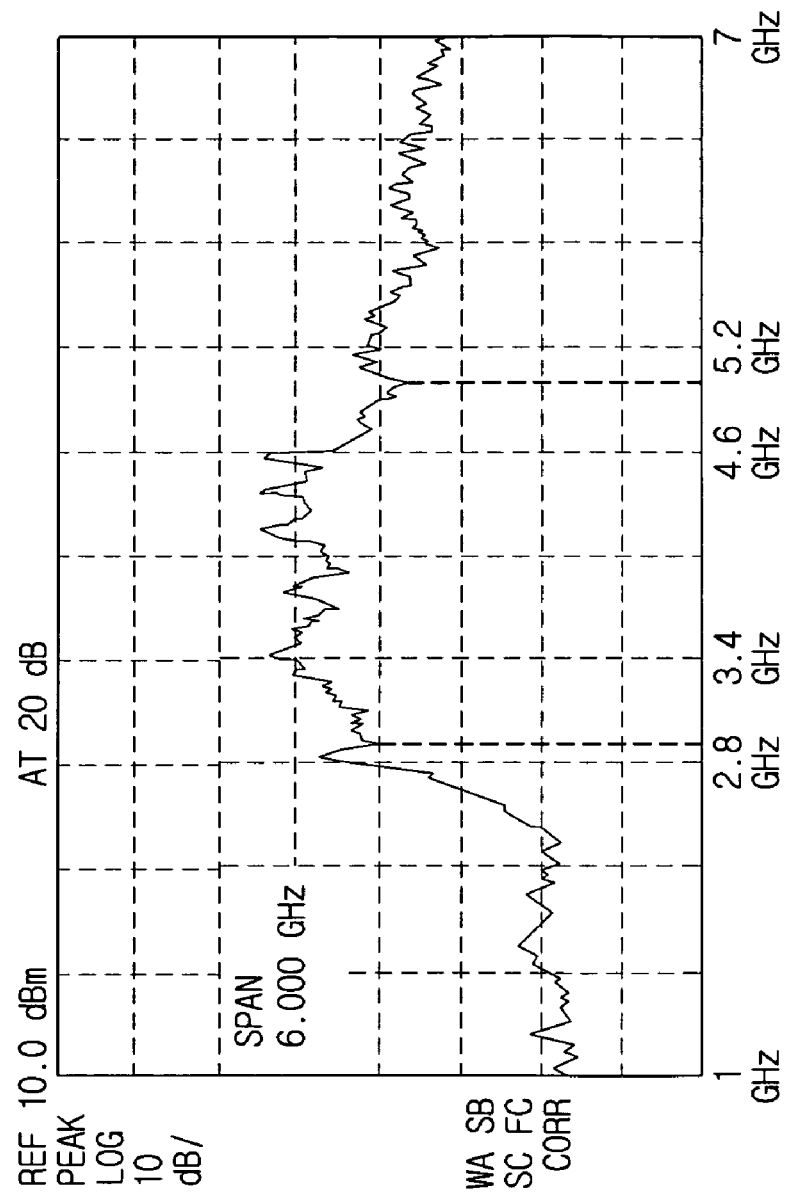
FIG. 7 is a graph showing a signal spectrum of the chaotic signal output from the chaotic signal generator of FIG. 6.

FIG. 7 is a graph showing a signal spectrum of the chaotic signal output from the chaotic signal generator 30 of FIG. 6.

As shown in FIG. 7, it is noted that the chaotic signal output from the chaotic signal generator 30 is generated in the band of approximately 3 GHz~approximately 5 GHz which is the frequency band of the wireless communication system. That is, the UWB chaotic signal can be acquired without adding an oscillator which periodically oscillates with the defined amplitude and frequency.

As set forth above, since the chaotic signal generator of an exemplary embodiment of the present invention is structured in a simple manner using a plurality of amplifiers, its implementation is facilitated and the cost is reduced. Additionally, the frequency band of the chaotic signal, which is output easily, can be adjusted by changing the filtering band of the BPF used as a filter.

While the inventive concept of the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A signal generator comprising:
a plurality of nonlinear elements which are connected in a ring; and
a coupler which is connected in the ring to form a closed loop together with the plurality of the nonlinear elements, and feeds a portion of a signal back to one of the plurality of the nonlinear elements, and outputs a remaining portion of the signal,
wherein the coupler sets, as a coupling coefficient, a ratio of the portion of the signal output to the portion of the signal fed back.

2. The signal generator as in claim 1, wherein each of the nonlinear elements comprises an amplifier.

3. The signal generator as in claim 1, wherein the plurality of the nonlinear elements comprises a first amplifier, a second amplifier, and a third amplifier.

4. The signal generator as in claim 3, wherein the first amplifier operates in an amplification mode, the second amplifier operates in a harmonic mode, and the third amplifier operates in a non-linear clipping mode.

5. The signal generator as in claim 3, wherein the first amplifier receives the signal from the signal distributor and amplifies the received signal at a certain gain.

6. The signal generator as in claim 3, wherein the second amplifier receives an amplified signal from the first amplifier and generates harmonic components in a frequency spectrum.

7. The signal generator as in claim 3, wherein the third amplifier clips a signal received from the second amplifier at a certain level.

8. The signal generator as in claim 1, further comprising:
a filter which filters the signal which is output by the signal distributor based on a certain frequency bandwidth.

9. The signal generator as in claim 8, wherein the filter comprises a band pass filter (BPF).

10. The signal generator as in claim 3, wherein a chaotic signal is generated when the signal is repeatedly fed back to the first, second, and third amplifiers by the signal distributor.

11. The signal generator as in claim 3, wherein bias voltage is supplied to at least one end of the first, second, and third amplifiers.

12. The signal generator as in claim 1, further comprising a first capacitor disposed at one side of the ring.

13. The signal generator as in claim 12, further comprising a second capacitor wherein the plurality of the nonlinear elements comprise first, second, and third amplifiers, and
the first capacitor is disposed between the first amplifier and the second amplifier, and the second capacitor is disposed between the third amplifier and the signal distributor, respectively.

14. The signal generator as in claim 12, wherein the first capacitor is a variable capacitor which varies capacitance.

15. The signal generator as in claim 13, wherein the first and second capacitors adjust a level of the signal output from the first and third amplifiers.

16. The signal generator as in claim 13, wherein the first and second capacitors adjust a phase of the signal output from the ring to be a multiple of $2\pi$.

17. The signal generator as in claim 12, wherein the first capacitor adjusts a total gain of the ring to be greater than 1.

18. The signal generator as in claim 3, wherein the coupler receives as an input a signal output from the third amplifier and feeds the portion of the signal back to the first amplifier.

19. The signal generator as in claim 18, wherein the coupler comprises at least one passive component which sets the ratio.

20. A radio frequency (RF) communication system comprising:
a chaotic signal generator which comprises a plurality of nonlinear elements connected in a ring, and a signal distributor which is arranged in the ring, feeds part of a signal to at least one of the plurality of the nonlinear elements, and outputs a signal generated by one of the plurality of nonlinear elements;
a modulator which generates a chaotic carrier by combining the chaotic signal and a data signal which contains information; and
a transmission circuit which includes an antenna and which transmits the chaotic carrier which is generated by the modulator.

21. A signal generation method comprising:
arranging a plurality of nonlinear elements connected in a ring;
inputting a signal to one of the plurality of the nonlinear elements;
amplifying, at the nonlinear elements, the signal at a certain amplification rate;
receiving the amplified signal and generating a harmonic component of a frequency;

clipping the signal at a certain level; and feeding part of the signal back to one of the plurality of the nonlinear elements and outputting a remainder of the signal.

22. The signal generation method as in claim 21, further comprising:

filtering the remainder of the signal which is output based on a certain frequency bandwidth.

23. The signal generation method as in claim 22, wherein the filtering is performed by a band pass filter (BPF).

24. The signal generation method as in claim 21, wherein a chaotic signal is generated when the signal is repeatedly processed through the amplifying, the generating of the frequency component, and the clipping.

25. The signal generation method as in claim 21, further comprising:

arranging at least one capacitor at one side of the ring.

26. The signal generation method as in claim 25, further comprising:

varying the capacitance of the at least one capacitor according to a level of the output signal.

27. The signal generation method as in claim 25, further comprising:

varying the capacitance of the at least one capacitor to make a phase of the remainder signal output from the ring to be a multiple of $2\pi$.

28. The signal generation method as in claim 25, further comprising:

varying the capacitance of the capacitor to make a total gain of the ring greater than 1.

* * * * *